United States Patent [19]

Miyata

[11] Patent Number: 5,142,345
[45] Date of Patent: Aug. 25, 1992

[54] STRUCTURE OF INPUT PROTECTION TRANSISTOR IN SEMICONDUCTOR DEVICE INCLUDING MEMORY TRANSISTOR HAVING DOUBLE-LAYERED GATE AND METHOD OF MANUFACTURING SEMICONDUCTOR DEVICE INCLUDING SUCH INPUT PROTECTION TRANSISTOR

[75] Inventor: Kazuaki Miyata, Hyogo, Japan

[73] Assignee: Mitsubishi Denki Kabushiki Kaisha, Tokyo, Japan

[21] Appl. No.: 746,187

[22] Filed: Aug. 15, 1991

Related U.S. Application Data

[63] Continuation of Ser. No. 506,614, Apr. 10, 1990, abandoned.

[30] Foreign Application Priority Data

Apr. 13, 1989 [JP] Japan .................................. 1-93707
Apr. 4, 1990 [JP] Japan .................................. 2-91262

[51] Int. Cl.⁵ .................. H01L 29/68; H01L 29/06; H01L 27/02
[52] U.S. Cl. .................. 357/23.13; 357/23.5; 357/23.14; 357/41
[58] Field of Search .............. 357/23.1, 23.13, 23.5, 357/23.14, 41; 365/185

[56] References Cited

U.S. PATENT DOCUMENTS

| | | |
|---|---|---|
| 4,663,645 | 5/1987 | Komori et al. ............... 357/23.5 |
| 4,774,421 | 9/1988 | Hartmann et al. ............ 365/185 |
| 4,835,597 | 5/1989 | Okuyama et al. ............ 357/23.1 |

FOREIGN PATENT DOCUMENTS

| | | | |
|---|---|---|---|
| 57-45975 | 3/1982 | Japan | 357/23.13 |
| 61-87373 | 5/1986 | Japan | 357/23.13 |
| 2152284 | 7/1985 | United Kingdom | 357/23.13 |

Primary Examiner—J. Carroll
Attorney, Agent, or Firm—Lowe, Price, LeBlanc & Becker

[57] ABSTRACT

Disclosed is a structure of a semiconductor device in which an internal circuit including a memory device and a transistor having an LDD structure, and an input protection device for protecting the internal circuit are formed on one semiconductor substrate, and a method of manufacturing such a semiconductor device. The input protection device and the memory device are formed at the same time. The input protection device as well as the memory device includes source/drain regions formed of high concentration impurity regions and formed in the surface of the semiconductor substrate, and a gate electrode formed of a plurality of conductor films and formed on the surface of the semiconductor substrate between the source/drain regions. When an abnormal voltage is applied to an interconnection for supplying an electrical signal to the internal circuit, a charge flows from the interconnection through one source/drain region of the input protection device into the semiconductor substrate, so that the internal circuit is protected against an excessive charge.

6 Claims, 13 Drawing Sheets

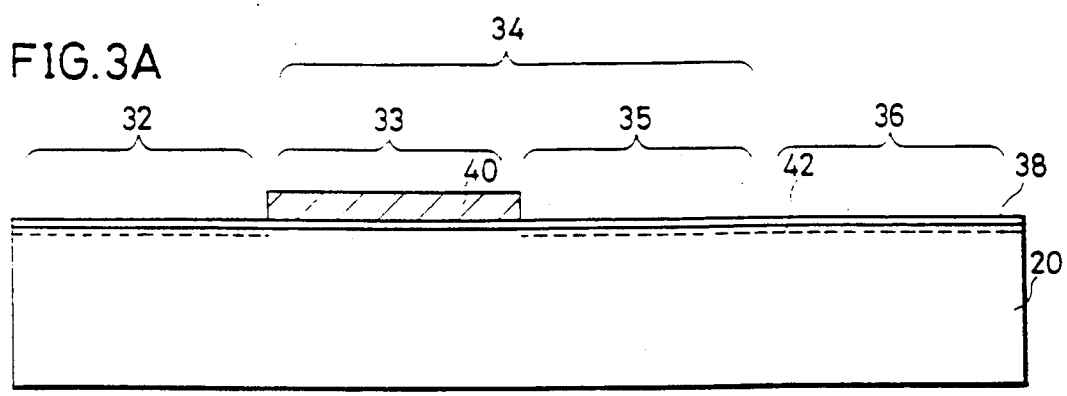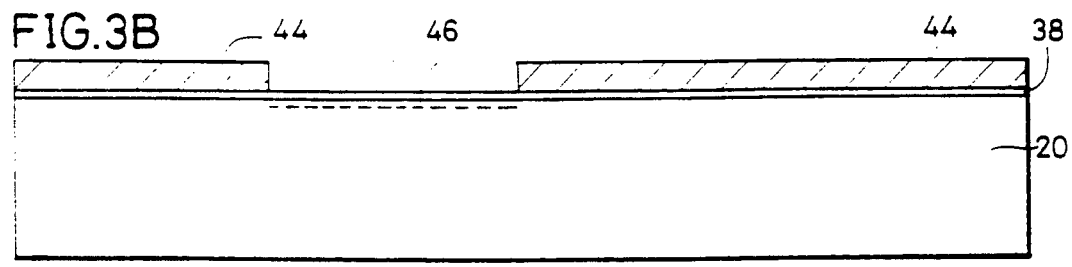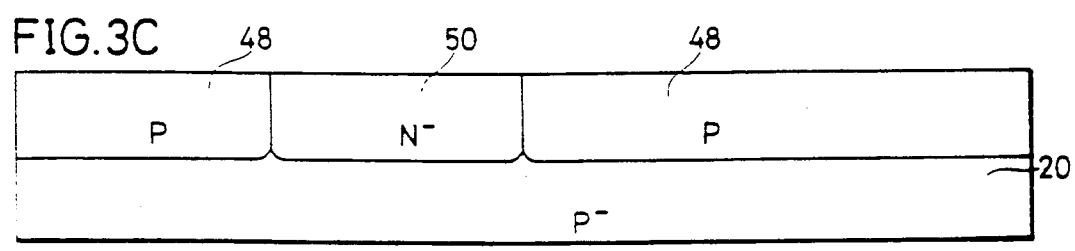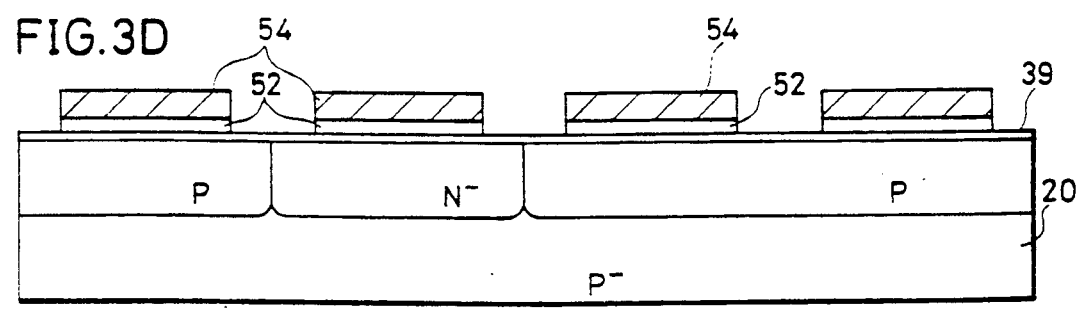

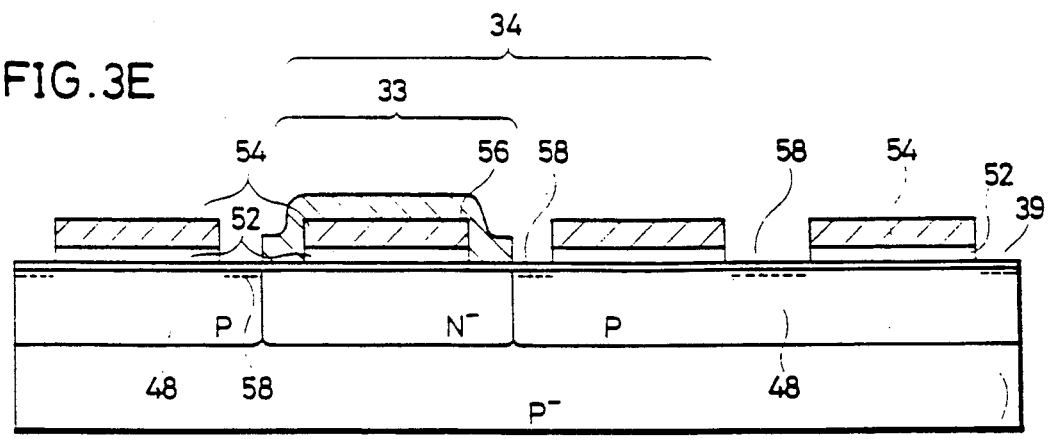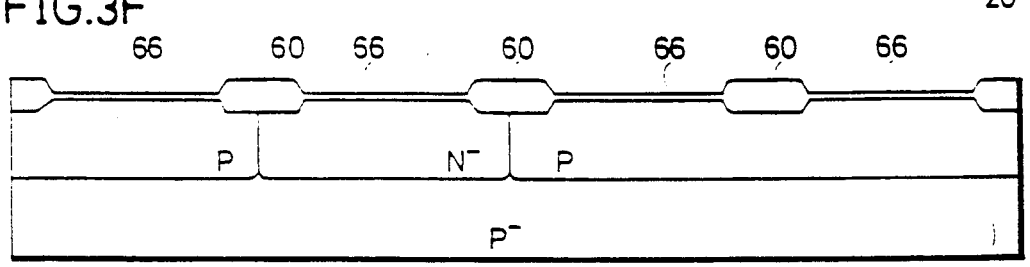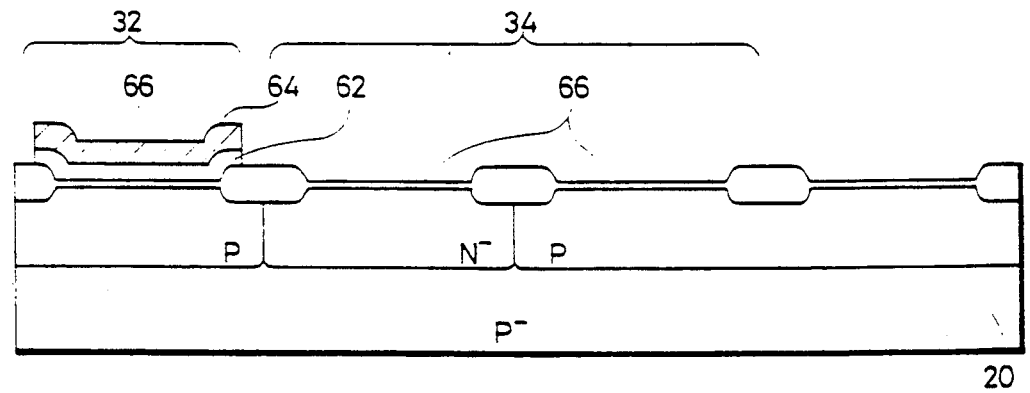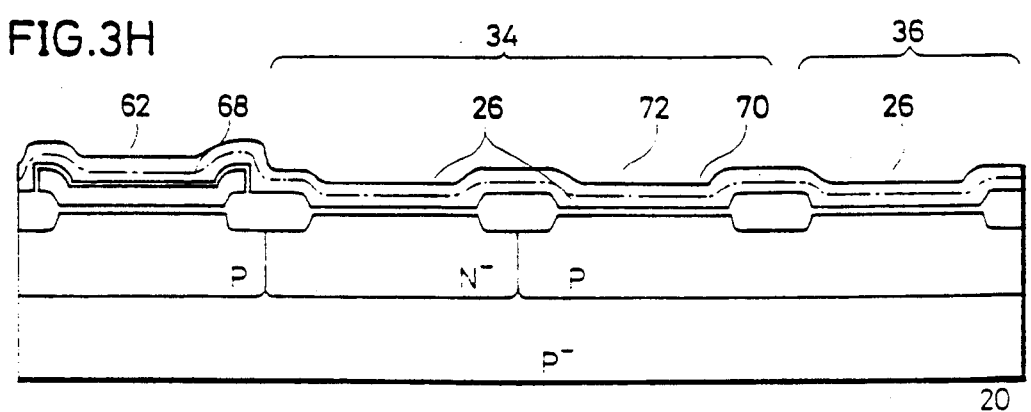

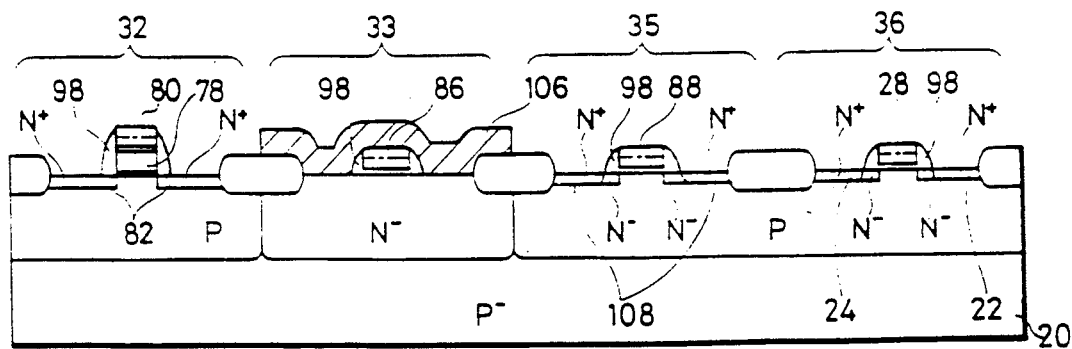
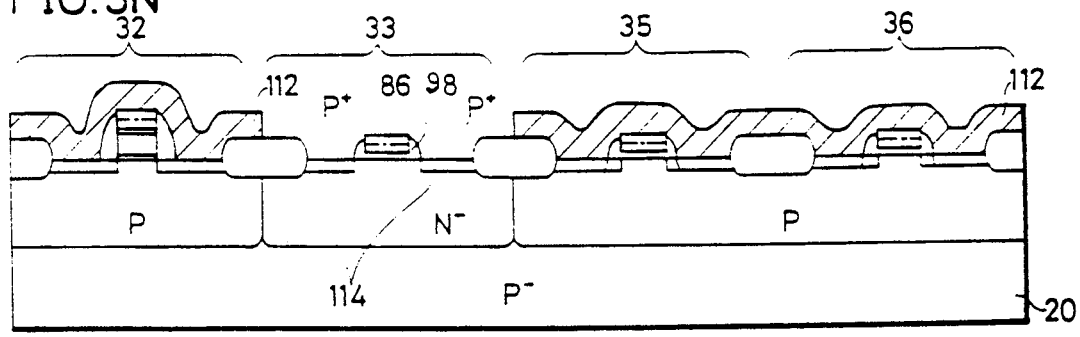
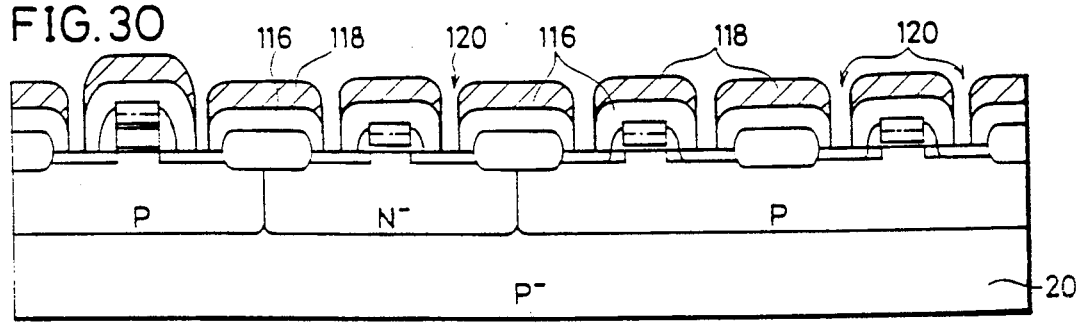
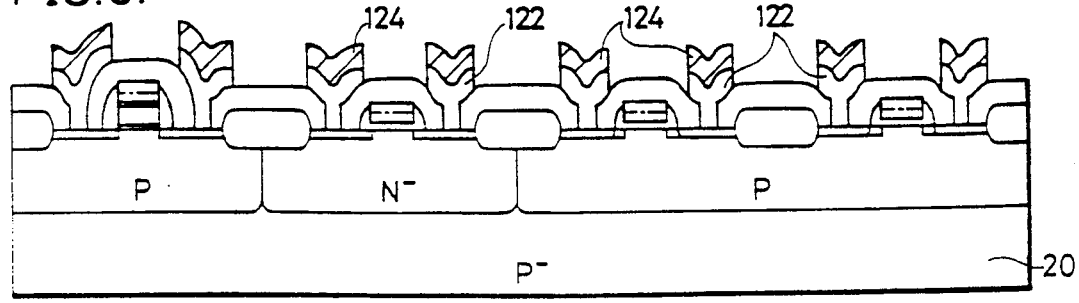

STRUCTURE OF INPUT PROTECTION TRANSISTOR IN SEMICONDUCTOR DEVICE INCLUDING MEMORY TRANSISTOR HAVING DOUBLE-LAYERED GATE AND METHOD OF MANUFACTURING SEMICONDUCTOR DEVICE INCLUDING SUCH INPUT PROTECTION TRANSISTOR

This application is a continuation of application Ser. No. 07/506,614 filed Apr. 10, 1990, now abandoned.

BACKGROUND OF THE INVENTION

1. Field of the Invention

The present invention relates generally to semiconductor devices, and more particularly to a structure of an input protection transistor in a semiconductor device including a memory transistor having a double-layered gate. The invention further relates to a method of manufacturing such a semiconductor device.

2. Description of the Background Art

FIG. 1 is a plan view of a semiconductor device to be a background of the present invention. Referring to FIG. 1, a semiconductor device 2 comprises a RAM (Random Access Memory) region 4, an EPROM (Erasable Programmable Read Only Memory) region 6, a CPU (Central Processing Unit) region 8, and a peripheral circuit 10 having input/output functions, provided at peripheries of the above regions 4, 6 and 8. FIGS. 2A-2C show the structure of an input protection circuit in a region II including the peripheral circuit shown in FIG. 1.

The structure of the input protection circuit will now be described with reference to FIGS. 1 and 2A-2C. An electrode pad 12 for receiving an electrical signal to be supplied to the semiconductor device 2 is provided at peripheral portions of the semiconductor device 2. The electrode pad 12 is connected through an interconnection 14 to an inverter 16 as one example of an internal logic circuit. Although the internal logic circuit is not limited to the inverter, the inverter will be described as one example of a CMOS (Complementary Metal Oxide Semiconductor) device. Such internal logic circuits are provided in the peripheral circuit 10, the CPU 8, the EPROM 6 and the RAM 4. That is, a large number of internal logic circuits are provided in the semiconductor device 2. As shown in FIG. 2B, the inverter 16 comprises a P channel MOS transistor 15 and an N channel MOS transistor 17.

An input protection transistor 18 is connected to the interconnection 14 for electrically connecting the inverter 16 and the electrode pad 12 so as not to apply an overvoltage to the inverter 16. Referring to FIG. 2C, the input protection transistor 18 comprises: N⁻ source/drain regions 22, 24 formed apart from each other in a major surface of a P type semiconductor substrate 20; N⁻ source/drain regions 23, 25 formed adjacently to the N⁺ source/drain regions 22, 24, respectively; a gate insulator film 26 formed on a surface region of the semiconductor substrate 20 between the N⁻ source/drain regions 23 and 25; and a gate electrode 28 formed on the gate insulator film 26. The input protection transistor 18 is an N channel transistor. In the input protection transistor 18, one N⁻ source/drain region 22 is connected to the interconnection 14, while the other N⁺ source/drain region 24, the gate electrode 28 and the semiconductor substrate 20 are all grounded. The gate electrode 28 is grounded in order that the transistor 18 is always OFF.

When a human body touches the electrode pad 12, a high voltage caused by friction between the human body and clothes is applied to the electrode pad 12. At this time, a charge flows into the semiconductor substrate 20 through the interconnection 14 and through the N⁺ source/drain region 22, so that the charge is prevented from flowing into a gate electrode of the inverter 16. Therefore, even when a surge voltage is applied to the electrode pad 12, the inverter 16 is hardly destroyed. It is considered that the charge flows into the semiconductor substrate 20 rather than into the gate electrode of the inverter 16 because the semiconductor substrate 20 has a larger capacitance than the gate electrode of the inverter 16.

FIGS. 3A-3Q are cross sectional views showing a process for manufacturing the semiconductor device to be the background of the invention.

Referring to FIG. 3A, a P type silicon substrate 20 comprises an EPROM region 32, a CMOS region 34 and an input protection transistor region 36. These regions are drawn as adjacent to one another in the figure; however, it should be understood that the regions are not necessarily adjacent to one another, but exist on one substrate. In order to simplify the description, the structure of only one memory device in the EPROM region 32, of one CMOS device in the CMOS region 34 and of one transistor in the input protection transistor region 36 is shown, and the detailed structures of the RAM 4, the EPROM 6, the CPU 8 and peripheral circuit 10 shown in FIG. 1 are not shown in the figures.

The EPROM region 32 is a region where the EPROM 6 is to be formed. The CMOS region 34 is a region where the inverter 16 is to be formed, and comprises a P channel transistor region 33 and an N channel transistor region 35. The input protection transistor 36 is a region where the input protection transistor 18 is to be formed. A silicon oxide film 38 is formed on a major surface of the P type silicon substrate 20 by thermal oxidation. A resist film 40 is formed in only the P channel transistor region 33 by employing photolithography, and boron is ion-implanted into the major surface of the silicon substrate 20, with the resist film 40 used as a mask. Thus, a boron ion-implanted layer 42 is formed in the surfaces of the EPROM region 32, N channel transistor region 35 and input protection transistor region 36. The resist film 40 is then removed.

Referring to FIG. 3B, a resist film 44 is formed by photolithography on the EPROM region 32, N channel transistor region 35 and input protection transistor region 36. With the resist film 44 used as a mask, phosphorus is ion-implanted into the surface of the silicon substrate 20 so as to form a phosphorus ion-implanted layer 46 in the surface of the P channel transistor region 33. The resist film 44 is thereafter removed.

Referring to FIG. 3C, annealing is performed so as to form a P well 48 and an N well 50 in a surface region of the P type substrate 20. The oxide film 38 is then removed.

Referring to FIG. 3D, a silicon oxide film 39 is formed on the whole surface of the semiconductor substrate 20, and a silicon nitride film 52 is formed on the silicon oxide film 39, thereby to form a resist film on the silicon nitride film 52. This resist film is patterned so as to cover an element forming region. The silicon nitride film is etched, with a resultant resist film 54 thus formed employed as a mask, thereby leaving the silicon nitride film 52 only at the element forming region.

As shown in FIG. 3E, all of the P channel transistor region 33 in the CMOS region 34 is covered with a resist film 56. Boron is then ion-implanted into a surface region of the P well 48, with the resist films 54 and 56 employed as masks, so that a boron ion-implanted layer 58 is formed. The resist films 54 and 56 are thereafter removed. Regions uncovered with the silicon nitride film 52 are oxidized by a LOCOS (Local Oxidation of Si) method, thereby to form a field oxide film 60 as shown in FIG. 3F. A thickness of the field oxide film 60 is approximately 6000 Å. Then, the nitride etched away. Next, a gate oxide film 66 having a thickness of 370 Å is newly formed on the surface of the silicon substrate 20.

Referring to FIG. 3G, a polysilicon film is formed on the overall surface of the silicon substrate 20 and then doped with phosphorus, thereby to be made of N type. A resist film 64 is then formed on the polysilicon film in the EPROM region 32 by photolithography. Thereafter, with the resist film 64 used as a mask, the polysilicon film is etched, thereby leaving the polysilicon film 62 in only the EPROM region 32. The resist film 64 is then removed. The polysilicon film 62 is to be a floating gate of EPROM and is approximately 3000 Å thick. Next, in order to control a threshold voltage of a MOS transistor repetition of applying the resist and implanting ions carries out channel doping for each transistor, and then the oxide film 66 other than beneath the polysilicon film 62 is then removed.

With reference to FIG. 3H, a gate oxide film 26 is formed in the CMOS region 34 and the input protection transistor region 36 by oxidation. An oxide film 68 is formed at the side surface and the upper surface of the polysilicon film 62 at this time. Thereafter, a polysilicon film 70 is formed on the overall surface of the silicon substrate 20 and then doped with phosphorus. A molybdenum silicide film 72 is formed on the polysilicon film 70. The polysilicon film 70 is approximately 2800 Å in thickness, while the molybdenum silicide film 72 is approximately 2300 Å in thickness. The oxide film 26 is approximately 250 Å in thickness in the input protection transistor region 36.

Referring to FIG. 3I, a resist film 76 is formed on the overall surfaces of the CMOS region 34 and input protection transistor region 36 and in a gate forming region of the EPROM region 32. Etching is carried out with the resist film 76 used as a mask, and the molybdenum silicide film 72, the polysilicon film 70, the oxide film 68, the polysilicon film 62 and the gate oxide film 66 are all removed in regions of the EPROM region 32 other than its gate forming region. The remaining polysilicon film 62 constitutes a floating gate 78, while the remaining polysilicon film 70 and molybdenum silicide film 72 together constitute a control gate 80. The resist film 76 is then removed.

With reference to FIG. 3J, with the control gate 80 and molybdenum silicide film 72 employed as masks, arsenic is ion-implanted into the overall surface of the semiconductor substrate 20, thereby to form an $N^-$ source/drain region 82 in the surface region of the P well 48. A gate length La of the floating gate 78 and that of the control gate 80 are both approximately 1.2 μm.

With reference to FIG. 3K, a resist film 84 is formed on the gate forming region of each of the CMOS region 34 and input protection transistor region 36 and on the overall surface of the EPROM region 32. Etching is then carried out with the resist film 84 used as a mask, thereby removing the molybdenum silicide film 72 and polysilicon film 70 in the regions of the CMOS region 34 and input protection transistor region 36 other than their gate forming regions. Thus, gate electrodes 86 and 88 in the CMOS region 34 and a gate electrode 28 in the input protection transistor region 36 are formed. The resist film 84 is thereafter removed.

As shown in FIG. 3L, a resist film 92 is formed on the overall surfaces of the EPROM region 32 and the P channel transistor region 33 which is a portion of the CMOS region 34. Phosphorus is ion-implanted with the resist film 92, and the gate electrodes 88 and 28 used as masks, thereby forming an $N^-$ source/drain region 94 in the N channel transistor region 35 and $N^-$ source/drain regions 23 and 25 in the input protection transistor region 36. The $N^-$ source/drain regions 23, 25 and 94 are regions having low concentration impurities. The resist film 92 is then removed.

A gate length Lb of the gate electrode 88 in the N channel transistor region 35 is approximately 1.3 μm, while that Lc of the gate electrode 86 in the P channel transistor region 33 is approximately 1.5 μm.

Referring to FIG. 3M, an insulator film is formed on the overall surface of the silicon substrate 20 having gate electrodes on its surface, and the insulator film is then subjected to anisotropical etching. Sidewalls 98 are thus formed at the peripheries of the gates 78, 80, 86, 88 and 28. Thereafter, a resist film 106 is formed on the overall surface of the P channel transistor region 33. Arsenic is ion-implanted, with the resist film 106, the gates 28, 78, 80 and 88, and their surrounding sidewalls 98 employed as masks. Accordingly, an $N^+$ source/drain region 108 in the N channel transistor region 35 and $N^+$ source/drain regions 22 and 24 in the input protection transistor region 36 are formed, resulting in a so-called LDD (Lightly Doped Drain) structure. At this time, an impurity concentration of the $N^+$ source/drain region 82 in the EPROM region 32 becomes further increased. The resist film 106 is then removed.

Referring to FIG. 3N, a resist film 112 is formed over the overall surface of the EPROM region 32 and over that of the N channel transistor region 35 and input protection transistor region 36. Thereafter, boron is ion-implanted, with a resist film 112, a gate electrode 86 and its surrounding sidewalls 98 used as masks. A $P^+$ source/drain region 114 is thus formed in the P channel transistor region 33. The resist film 112 is then removed.

With reference to FIG. 3O, over the whole surface of the silicon substrate 20 is formed a BPSG (Boro-Phospho Silicate Glass) film 116. A thickness of the BPSG film 116 is approximately 10000Å. A resist film 118 is then formed on a predetermined region of the BPSG film 116. Etching is then carried out with the resist film 118 used as a mask so as to form a contact hole 120. The resist film 118 is thereafter removed.

As shown in FIG. 3P, an Al—Si film 122 is formed on the BPSG film 116 so as to fill the contact hole 120. A resist film 124 is then formed in a predetermined region on the Al—Si film 122 and is then subjected to etching, with the resist film 124 used as a mask, thereby forming an Al—Si interconnection layer 122. A thickness of the Al—Si interconnection layer 122 is approximately 8500Å. The resist film 124 is thereafter removed.

Referring to FIG. 3Q, over the whole surface of the silicon substrate 20 is formed a protection film 126 made of a silicon nitride or a silicon oxide. Through all the foregoing processing steps, there are formed a memory transistor 128 in the EPROM region 32, internal logic transistors 15 and 17 in the CMOS region 34, and an input protection transistor 18 in the input protection transistor region 36.

Next, an operation of a memory cell in the EPROM region will now be described with reference to FIG. 4. When information is written into a cell, a high voltage (10-20V) is applied to a control gate 80 and a drain 82$b$ of a memory cell 128, so that avalanche carrier (electrons) is produced at end portions of the drain 82$b$. The application of a positive voltage to the control gate 80 causes the electrons to be injected into a floating gate 78, overcoming an energy barrier of a gate insulator film 66. Since the floating gate 78 is not electrically connected to the other circuit portions, the gate is capable of storing a charge semipermanently. When the charge is stored into the floating gate 78, a threshold voltage Vth of the memory cell becomes higher than that before the injection of electrons. States before and after injecting electrons into the floating gate 78 are made correspondent to "1" and "0" (e.g., "1" represents the state that Vth is high, while "0" represents the state that Vth is low), thus causing the memory cell 128 to have a memory function. When the electrons stored in the floating gate 78 are discharged from the memory cell, ultraviolet rays are directed to the cell 128.

The LDD structure is intended to be formed in the drain of the N channel transistor 17 in the CMOS region 34, in the above described product, for the purpose of preventing a change in the threshold voltage due to hot carrier, caused along with reduction of a channel length and also increasing a breakdown voltage between the source/drain.

In the semiconductor device manufactured through the above manufacturing steps, all the N channel transistors, i.e., the input protection transistor 134 and the internal logic transistor 132 other than those in the EPROM region 32 have the LDD structure. Therefore, the following problems are involved.

Referring to FIG. 2C, since the N⁻ source/drain 23, 25 in the input protection transistor 18 has a higher resistance value than that of the N⁻ source/drain 22, 24, an application of a surge voltage to the electrode pad 12 generates heat at the N⁻ source/drain, thereby sometimes destroying the N⁻ source/drain.

In addition, the input protection circuit shown in FIGS. 2A and 2C is connected also to an interconnection for supplying an information writing voltage to the memory cell in the EPROM region 32 in order to protect the memory cell. However, the input protection transistor is sometimes destroyed due to an occurrence of an overshoot voltage and thus a generation of heat in the N⁻ source/drain, similarly to the above case, when a voltage for writing is applied.

SUMMARY OF THE INVENTION

It is an object of the present invention to prevent an input protection transistor from being destroyed by a surge voltage or an overshoot voltage.

It is another object of the present invention to provide a method of manufacturing a semiconductor device having an input protection transistor which is not destroyed even when supplied with a surge voltage or an overshoot voltage.

A semiconductor device in accordance with the present invention includes an input protection transistor having its source/drain impurity regions formed only of high concentration impurity regions. A gate structure formed of a plurality of conductor films may be applied to the input protection transistor as well as to a memory device formed on the same semiconductor substrate. One source/drain region of the input protection transistor is connected to an internal circuit formed on the same semiconductor substrate, while the other source/drain region, a gate electrode and the semiconductor substrate are all grounded. The grounded gate electrode may be a first conductor layer as well as a second conductor layer.

According to a method of manufacturing a semiconductor device in accordance with the present invention, a gate electrode formed of a plurality of conductor layers is formed in a memory device forming region and in an input protection transistor forming region. A single source/drain region is then formed by implanting high concentration impurity ions into these regions, with the gate electrode used as a mask. The memory device forming region and input protection transistor forming region are then covered with a resist film. Next, a gate electrode is formed in a region where a transistor of an internal circuit is to be formed. With the gate electrode used as a mask, low concentration impurity ions are implanted, and then sidewalls are formed at peripheries of the gate electrode. Then, high concentration impurity ions are implanted with the sidewalls used as masks. Accordingly, a source/drain region of an LDD structure is formed in the region where the transistor of the internal circuit is to be formed.

In accordance with the present invention, it is possible to make comparatively large the gradient of intensity of an electric field in the drain of the input protection transistor. It thus makes it possible to enhance a breakdown voltage for a surge voltage or an overshoot voltage. The input protection transistor and the memory device can be formed simultaneously, so that a smaller number of processing steps are required for the semiconductor device manufacturing method of the present invention, compared to a case where an input protection transistor is formed as a single-layered gate separately from a memory transistor, thereby facilitating the manufacture.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
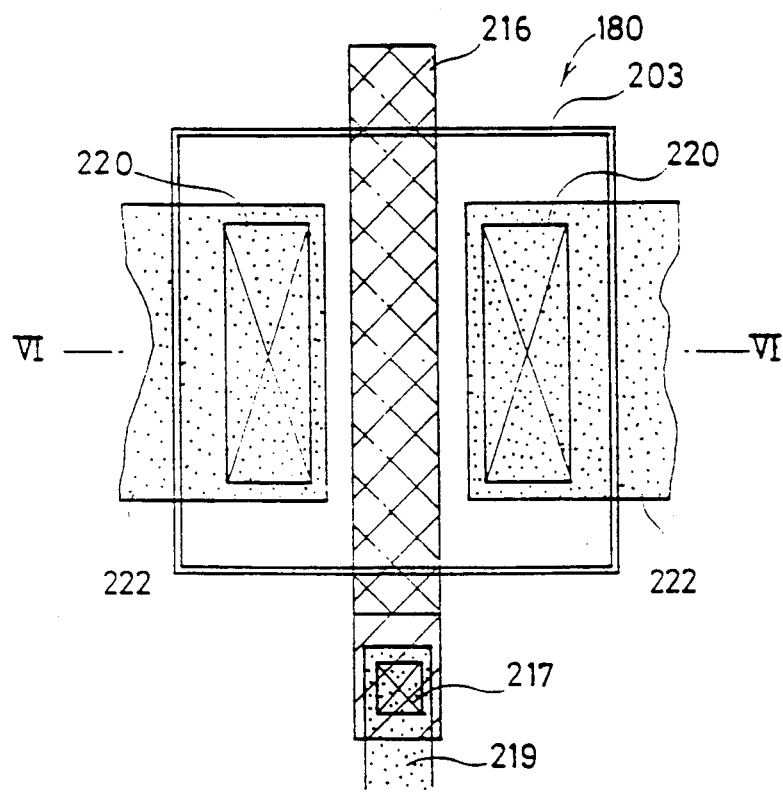
FIG. 5 is a plan view of an input protection transistor in accordance with one embodiment of the present invention.
Figure 6:
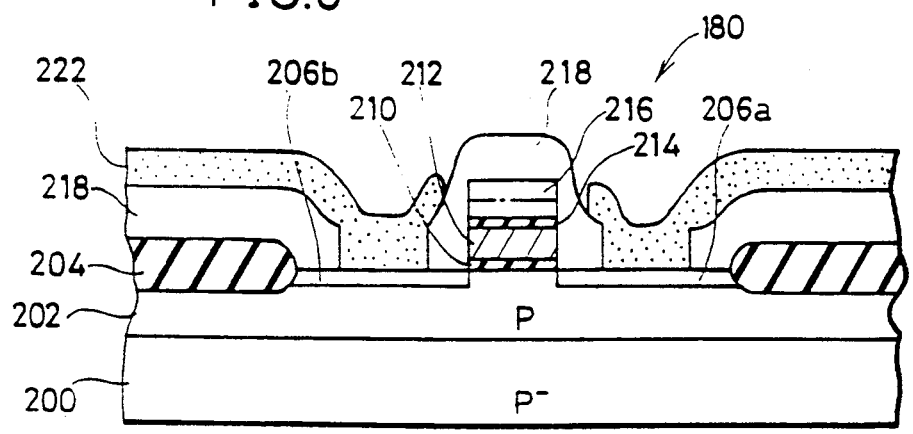
FIG. 6 is a cross sectional view taken along the line VI—VI shown in FIG. 5.

Referring to FIGS. 5 and 6, an input protection transistor 180 according to the present invention comprises: a P well 202 formed on a P type substrate 200; a field oxide film 204 for electrically isolating a field region 203 from another field region; N− source/drain regions 206a and 206b formed in the field region 203 apart from each other; an oxide film 210 formed on a region in a major surface of the substrate, between the N− source/drain regions 206a and 206b; a first gate 212 formed on the oxide film 210; an oxide film 214 formed on the first gate 212; a second gate 216 formed on the oxide film 214; an interlayer insulation film 218 formed on the semiconductor substrate 200 so as to cover the first and second gates; and an aluminum interconnection 222 electrically connected to the N− source/drain regions 206a and 206b through a contact hole 220 made in the interlayer insulation film 218. As shown in FIG. 5, the second gate 216 is electrically connected to an aluminum interconnection 219 through a contact hole 217.

Figure 7A:
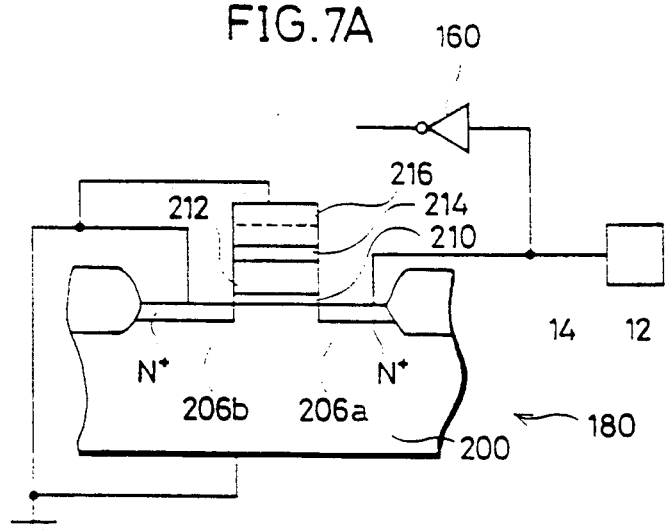
FIG. 7A is a diagram showing the input protection transistor and electrical structures of its peripheries shown in FIGS. 5 and 6.
Figure 7B:
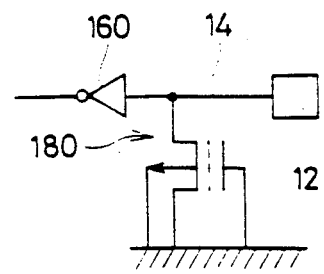
FIG. 7B is an equivalent circuit diagram thereof.

FIGS. 7A and 7B show the input protection transistor and its peripheral circuit shown in FIGS. 5 and 6. Referring to FIG. 7A, an electrode pad 12 is connected through an interconnection 14 to an inverter 160 as one example of an internal logic circuit. The above described input protection circuit 180 is connected to the interconnection 14 so as not to apply an overvoltage to the inverter 160.

Figure 1:
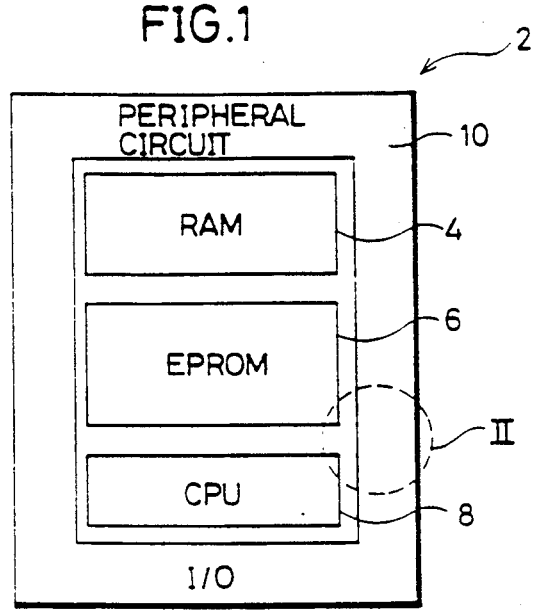
FIG. 1 is a plan view showing a semiconductor device to be a background of the present invention.
Figure 2A:
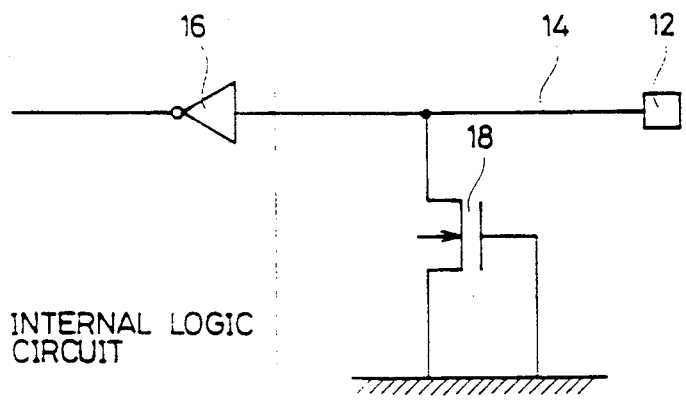
FIG. 2A is a diagram of a circuit in a region II shown in FIG. 1.
Figure 2B:
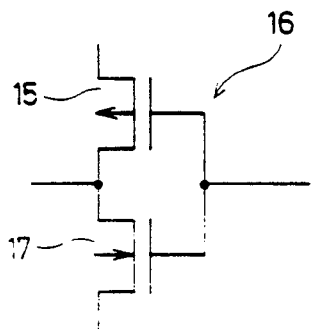
FIG. 2B is an equivalent circuit diagram of an inverter shown in FIG. 2A.
Figure 2C:
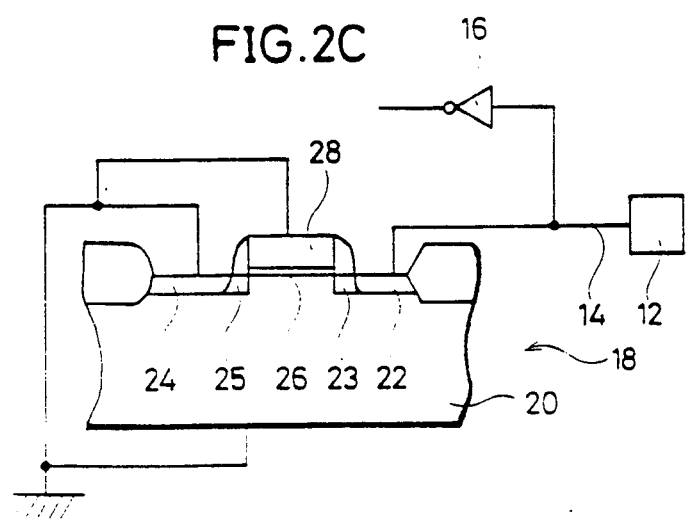
FIG. 2C is a diagram showing a structure of an input protection circuit shown in FIG. 2A.
Figure 3I:
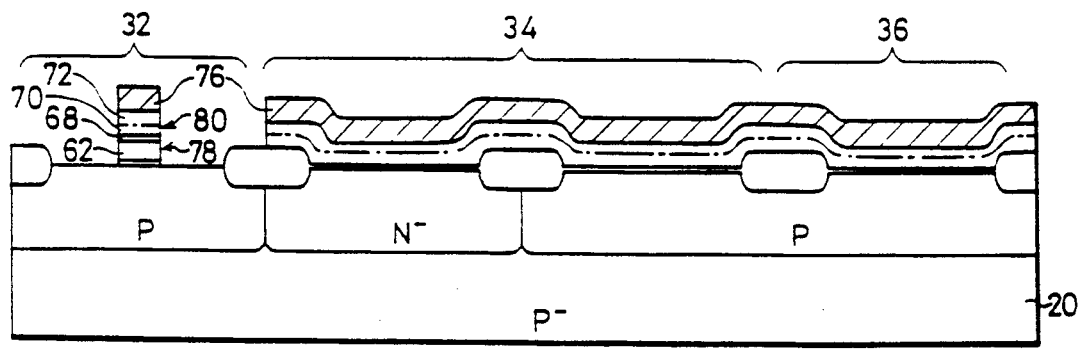
FIGS. 3A-3Q are cross sectional views showing a process for manufacturing the semiconductor device to be the background of the present invention.
Figure 3J:
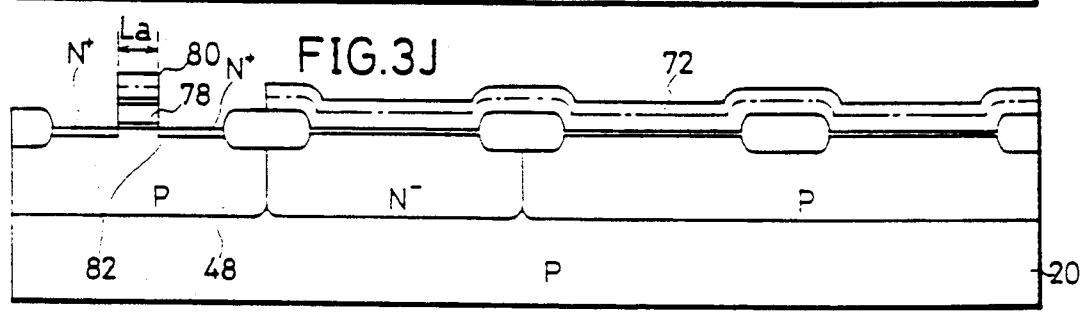
Figure 3K:
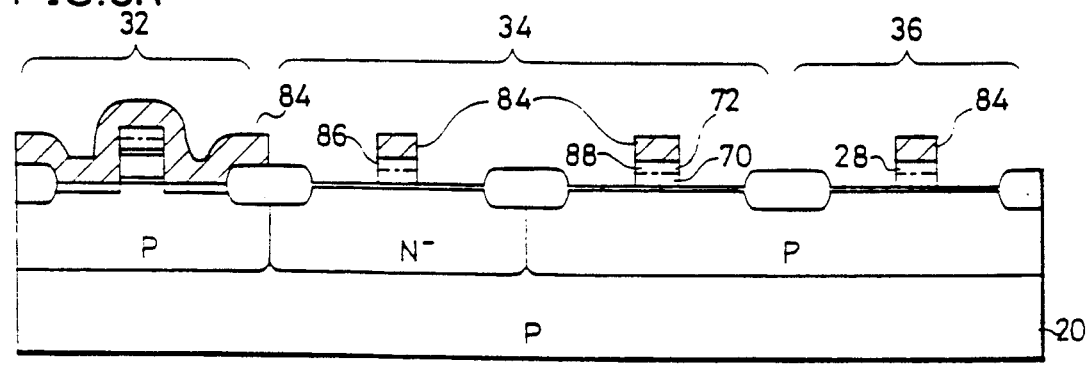
Figure 3L:
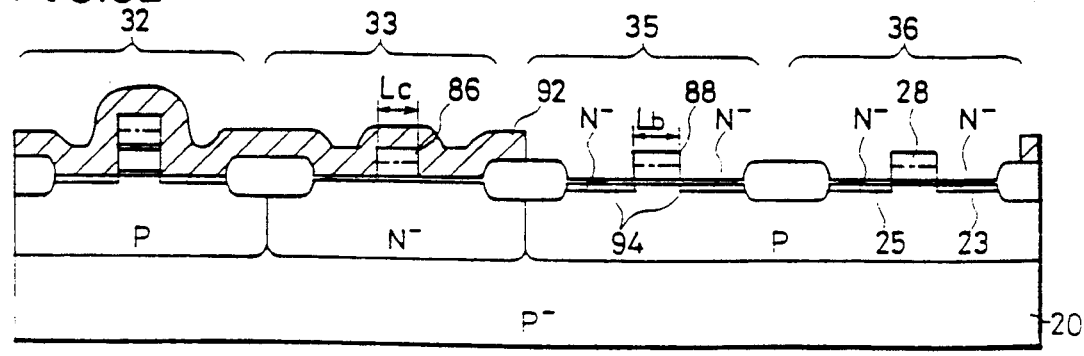
Figure 3Q:
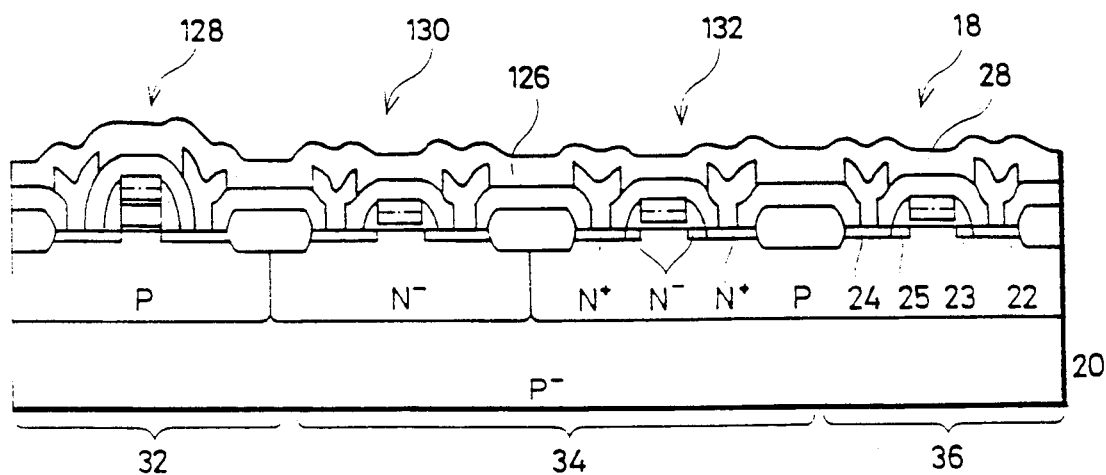
Figure 4:
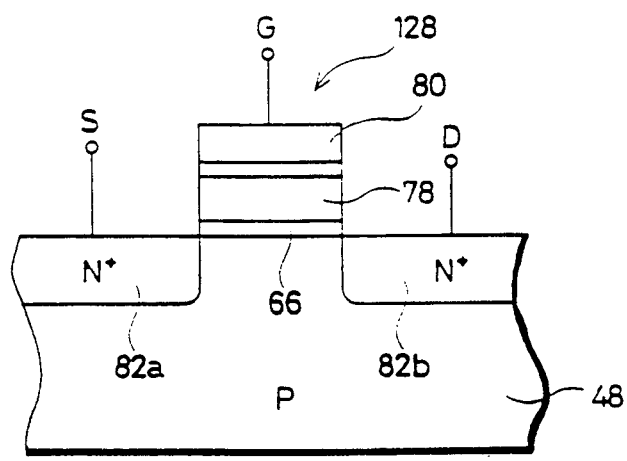
FIG. 4 is an enlarged cross sectional view of a memory cell shown in FIG. 3Q.

In the input protection transistor 180, one N+ source/drain region 206a is connected to the interconnection 14, while the other N+ source/drain region 206b, the second gate 216 as a gate electrode and the semiconductor substrate 200 are all grounded. When a surge voltage is applied to the electrode pad 12, a charge flows into the semiconductor substrate 200 through the interconnection 14 and through the N+ source/drain region 206a, but is prevented from flowing into a gate electrode of the inverter 160. A drain of the input protection transistor 180 is formed only of a high concentration impurity region without the low concentration impurity region as shown in FIG. 2C, so that the gradient of intensity of an electric field in the drain is comparatively large, resulting in no destruction of the input protection transistor.

Figure 8A:
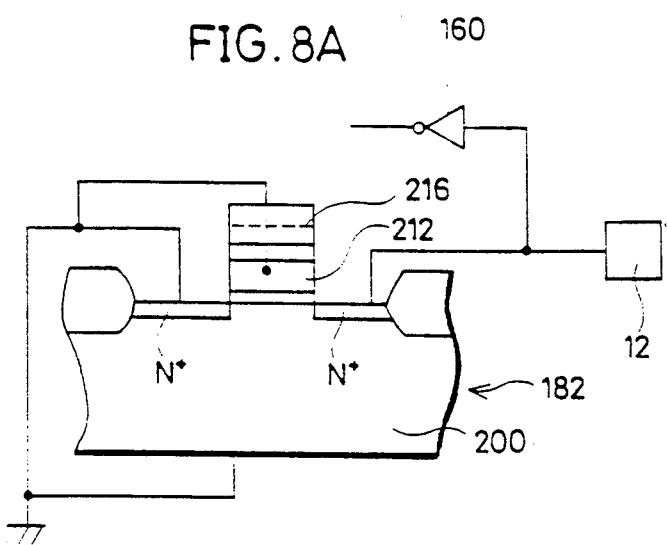
FIGS. 8A-8G are diagrams showing modifications of the input protection transistor shown in FIGS. 7A and 7B.
Figure 8B:
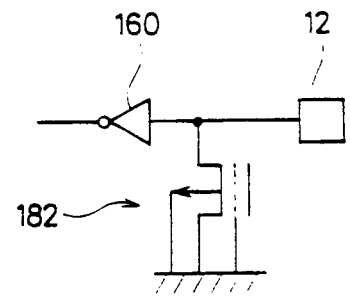
Figure 8C:
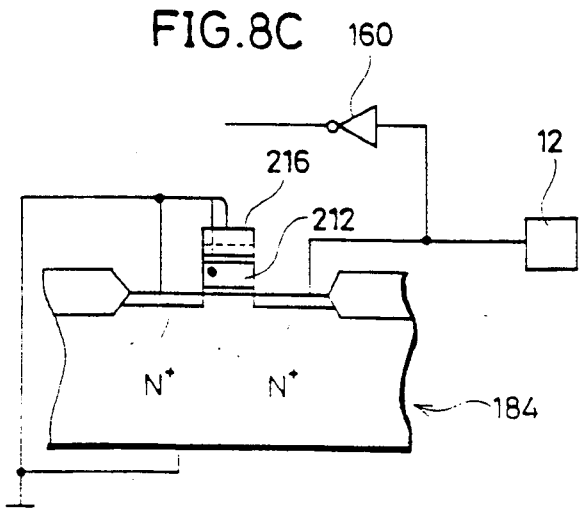
Figure 8D:
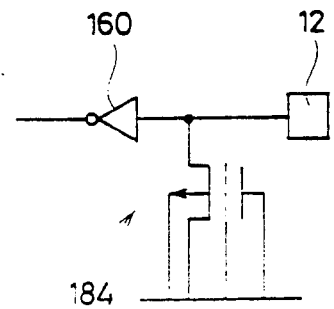
Figure 8E:
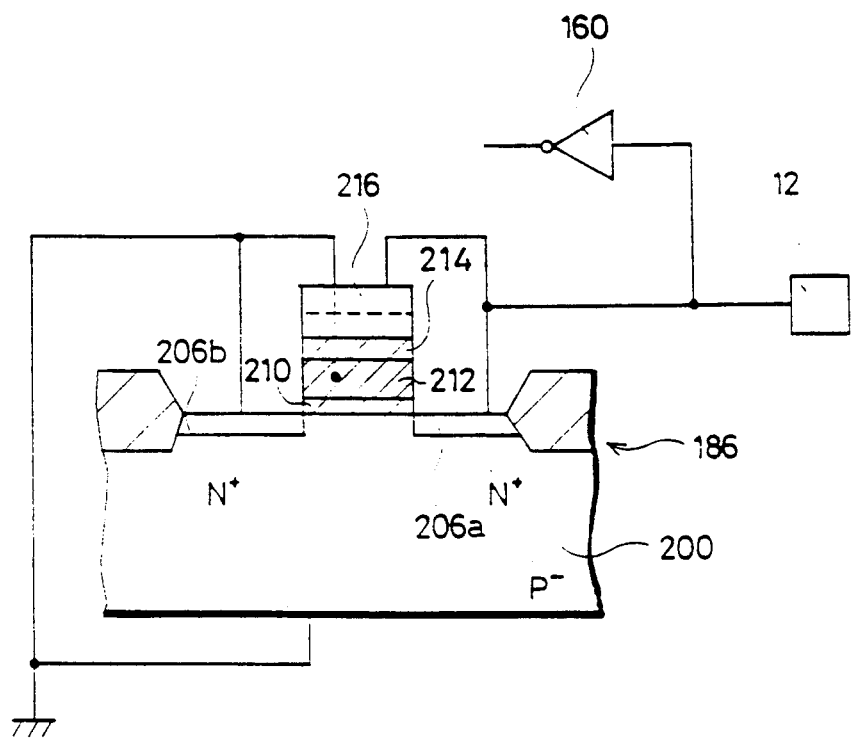
Figure 8F:
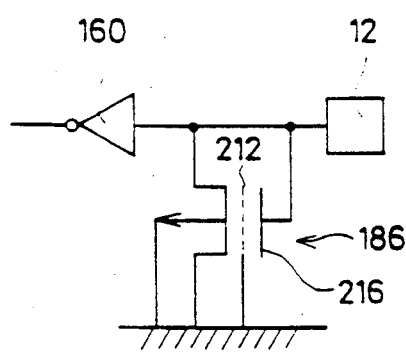
Figure 8G:
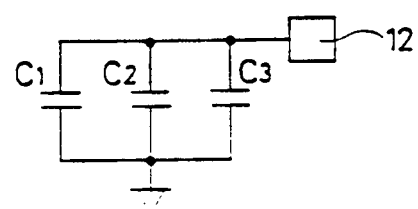

Modifications of the input protection transistor are shown in FIGS. 8A, 8B, 8C, 8D, 8E, 8F and 8G. In an input protection transistor shown in FIGS. 8A and 8B, not second gate 216 but the first gate 212 is grounded. The first gate 212 is grounded for the purpose that a charge is made possible to be stored between the first gate 212 and the semiconductor substrate 200 so as to increase a capacitance of the input protection transistor and thus make an extra charge provided to the electrode pad 12 easily escape into the semiconductor substrate 200. FIGS. 8C and 8D show such a case that both the first and second gates 212 and 216 are grounded. FIGS. 8E and 8F show a case where the first gate 212 is grounded, while the second gate 216 is connected to the electrode pad 12. When the connection is carried out as shown in the FIGS. 8E and 8F, it gives a structure that a drain-gate overlap capacitance $C_1$, a capacitance across a floating gate and a control gate (an interlayer capacitance) $C_2$, and a drain-substrate junction capacitance $C_3$ are connected in parallel, as shown in FIG. 8G, so that charge absorbing capabilities by these capacitances are increased and thus a surge breakdown voltage is increased.

Figure 9A:
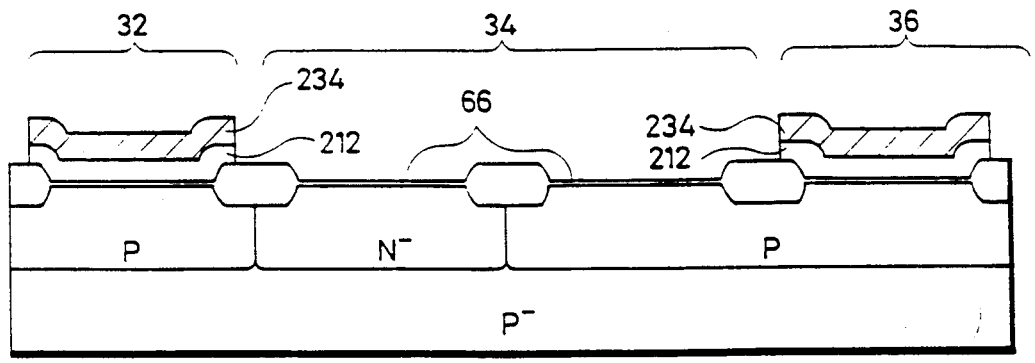
FIGS. 9A-9K are cross sectional views showing the process for manufacturing the semiconductor device according to the embodiment of the present invention.

Description will now be given of a process for manufacturing the semiconductor device according to one embodiment of the present invention, with reference to FIGS. 9A-9K. Since processing steps to be carried out before the step of FIG. 9A are identical to those shown in FIGS. 3A-3F, a description thereof will not be repeated. The processing steps shown in FIGS. 9A-9K are in correspondence with those shown in FIGS. 3G-3Q.

Referring to FIG. 9A, a polysilicon film 212 having a thickness of approximately 3000 Å is formed on the overall surface of a P type silicon substrate 200, and is then doped with phosphorus to be made of N type. A resist film 234 is then formed on the polysilicon film in an EPROM region 32 and in an input protection transistor region 36 by employing photolithography. Next, with the resist film 234 used as a mask, the polysilicon film 212 is etched, so that the polysilicon film 212 is left at the EPROM region 32 and input protection transistor region 36. The resist film 234 is then removed. In order to regulate a threshold voltage of an MOS transistor, repetition of applying the resist and implanting ions carries out channel doping for each transistor, and further, the oxide film 66 other than beneath the polysilicon film 212 is removed.

Figure 9B:
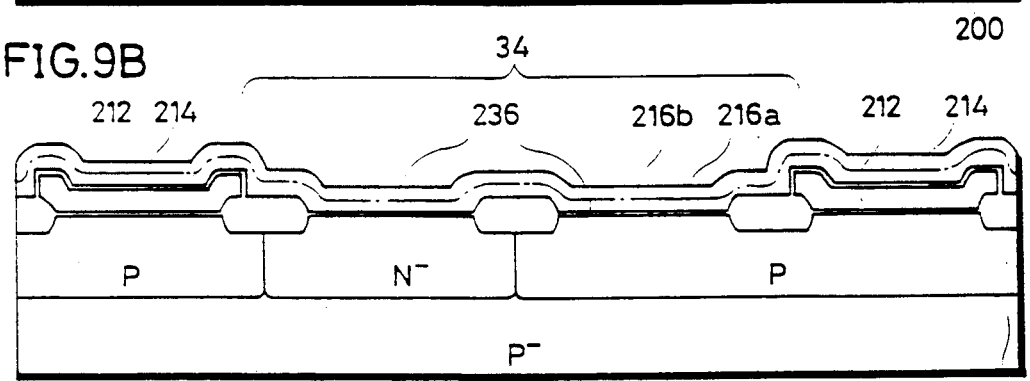

Referring to FIG. 9B, a gate oxide film 236 having a thickness of approximately 250 Å is formed in the CMOS region 34 by oxidation. At this time, an oxide film 214 is formed on the side surface and the upper surface of the polysilicon film 212. A polysilicon film 216a having a thickness of approximately 2800 Å is formed on the overall surface of the silicon substrate 200 and is then doped with phosphorus. Thereafter, a molybdenum silicide film 216b having a thickness of approximately 2300 Å is formed on the polysilicon film 216a.

Figure 9C:
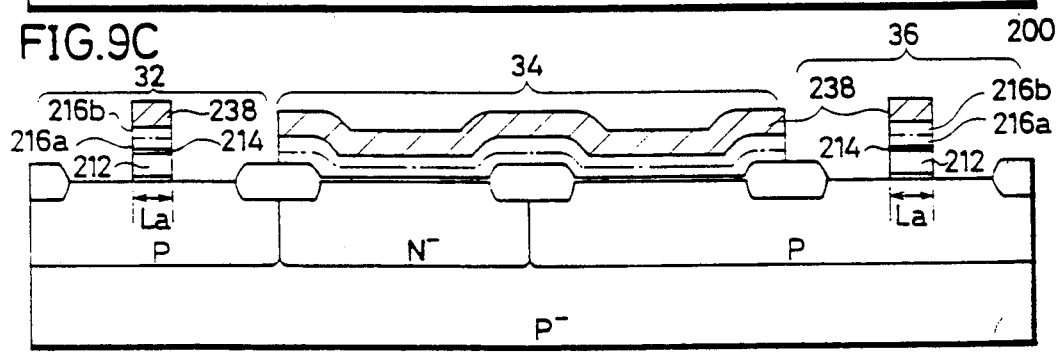

As shown in FIG. 9C, a resist film 238 is formed on the overall surface of the CMOS region 34 and in gate forming regions of the EPROM region 32 and input protection transistor region 36. Etching is then carried out, with the resist film 238 used as a mask, so as to remove the molybdenum silicide film 216b, the polysilicon film 216a, the oxide film 214, the polysilicon film 212 and the gate oxide film 66 in regions in the EPROM region 32 and input protection transistor region 36 other than their gate forming regions. The polysilicon film 212 left in the EPROM region 32 constitutes a floating gate, and the polysilicon film 216a and molybdenum silicide film 216b constitute a control gate. The polysilicon film 212 left in the input protection transistor region 36 constitutes the first gate shown in FIG. 6, while the polysilicon film 216a and molybdenum silicide film 216b in the region 36 constitute the second gate 216. A gate length of the gate in the EPROM region 32 is approximately 1.2 μm, while that of the gate in the input protection transistor region 36 is approximately 3.0 μm. The resist film 238 is then removed.

Figure 9D:
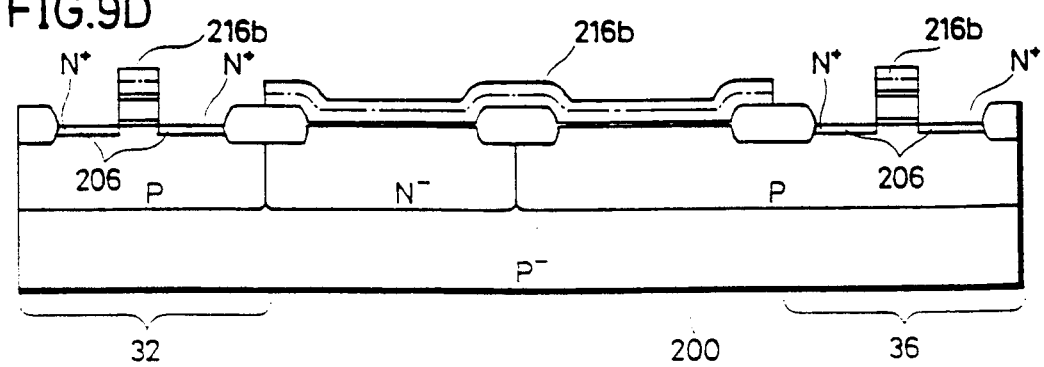

Referring to FIG. 9D, arsenic is ion-implanted into the overall surface of the semiconductor substrate 200, with the molybdenum silicide film 216b used as a mask, thereby forming an N+ source/drain region 206 in a surface region of each of the EPROM region 32 and the input protection transistor region 36.

Figure 9E:
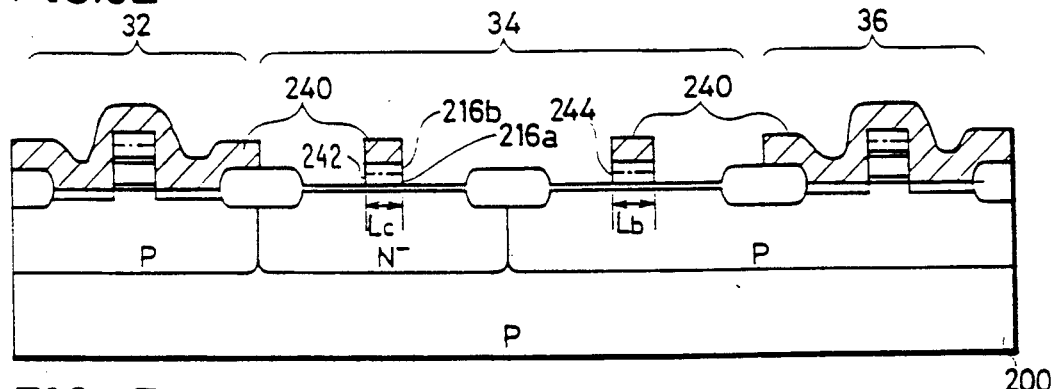

With reference to FIG. 9E, a resist film 240 is formed on a gate forming region of the CMOS region 34 and on the overall surface of the EPROM region 32 and input protection transistor region 36. With the resist film 240 used as a mask, etching is then carried out so as to remove the molybdenum silicide film 216b and polysilicon film 216a formed in regions in the CMOS region 34 other than its gate forming region. Therefore, gate electrodes 242 and 244 are formed in the CMOS region 34. A gate length Lc of the gate electrode 242 is approximately 1.5 μm, while that of the gate electrode 244 is approximately 1.3 μm. The resist film 240 is then removed.

Figure 9F:
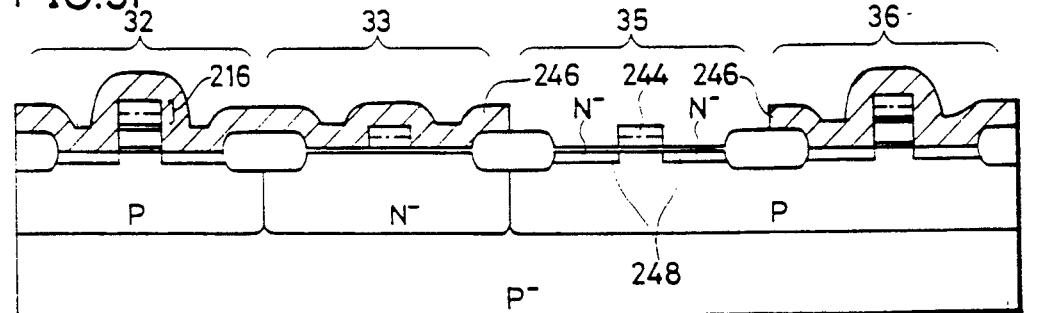

Referring to FIG. 9F, a resist film 246 is formed on the overall surfaces of the EPROM region 32, a P channel transistor region 33 which is a portion of the CMOS region 34, and the input protection transistor region 36. Phosphorous is then ion-implanted with the resist film 246 and the gate electrode 244 used as masks, thereby forming an N− source/drain region 248 in an N channel transistor region 35. The resist film 246 is then removed.

Figure 9G:
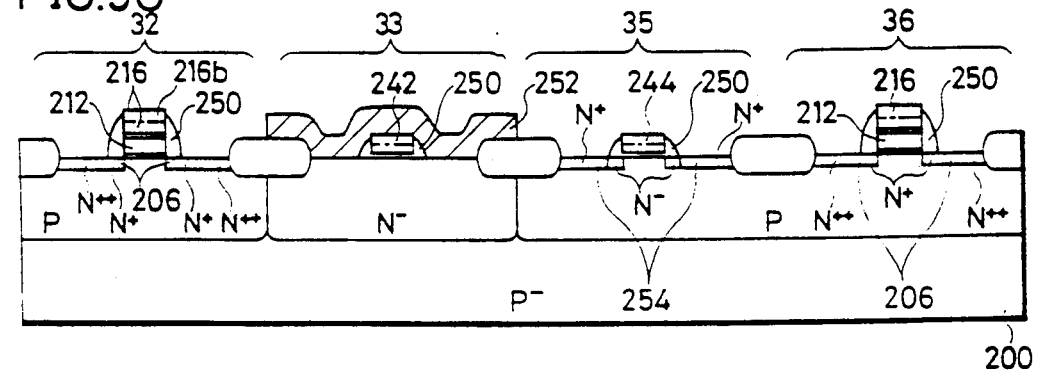

Referring to FIG. 9G, an oxide film is formed by a CVD (Chemical Vapor Deposition) method on the overall surface of the silicon substrate 200 having gate electrodes on its surface, and is then subjected to anisotropical etching by an RIE (Reactive Ion Etching) method. Accordingly, sidewalls 250 are formed at peripheries of the gates 212 and 216 in the CMOS region 32 and input protection transistor region 36, and at peripheries of the respective gate electrodes 242 and 244 in the P channel transistor region 33 and N channel transistor region 35. A resist film 252 is formed on the overall surface of the P channel transistor region 33. Next, arsenic is ion-implanted, employing the resist film 252, the gates 212, 216 and 244 in the CMOS region 32, N channel transistor region 35 and input protection transistor region 36, and the sidewalls 250 at their peripheries as masks. Thus, an N− source/drain region 254 is formed in the N channel transistor region 35, resulting in a so-called LDD structure. At this time, since N+ ions are further implanted into the N− source/drain region 206 in the EPROM region 32 and input protection transistor region 36, impurity concentration of regions other than beneath the sidewalls 250 is further increased. Implantation of arsenic into molybdenum silicide films 216 and 244 in the EPROM region 32, N channel transistor region 35 and input protection transistor region 36 is useful for planarization of a film to be formed on the films 216 and 244, as will be described later. The resist film 252 is then removed.

Figure 9H:
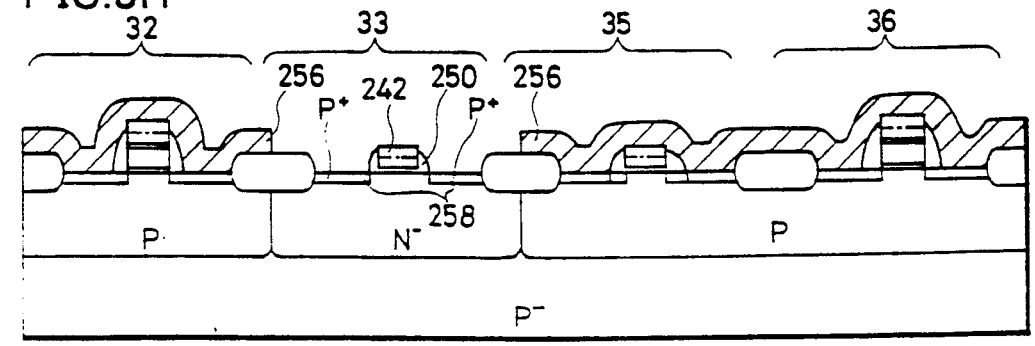

With reference to FIG. 9H, a resist film 256 is formed on the overall surfaces of the EPROM region 32, N channel transistor region 35 and input protection transistor region 36. Boron is then ion-implanted with the resist film 256, the gate 242 and the sidewalls 250 at their peripheries used as masks. Thus, a P− source/drain region 258 is formed in the P channel transistor region 33. The resist film 256 is then removed. For activation, a heat treatment is then carried out, for example, in nitrogen atmosphere.

Figure 9I:
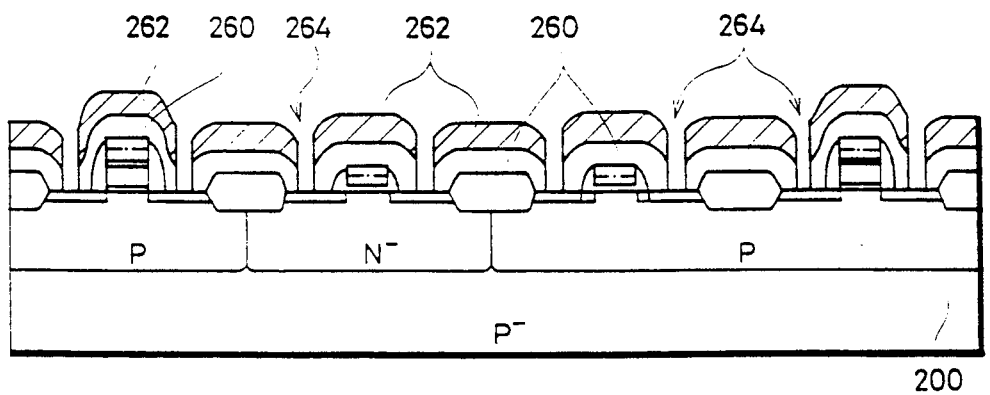

Referring to FIG. 9I, a BPSG film 260 having a thickness of approximately 1000 Å is formed on the whole surface of the silicon substrate 200 by the CVD method. A resist film 262 is formed thereafter on a predetermined region of the BPSG film 260. Etching is then carried out with the resist film 262 used as a mask so as to form contact holes 264. The resist film 262 is then removed.

Figure 9J:
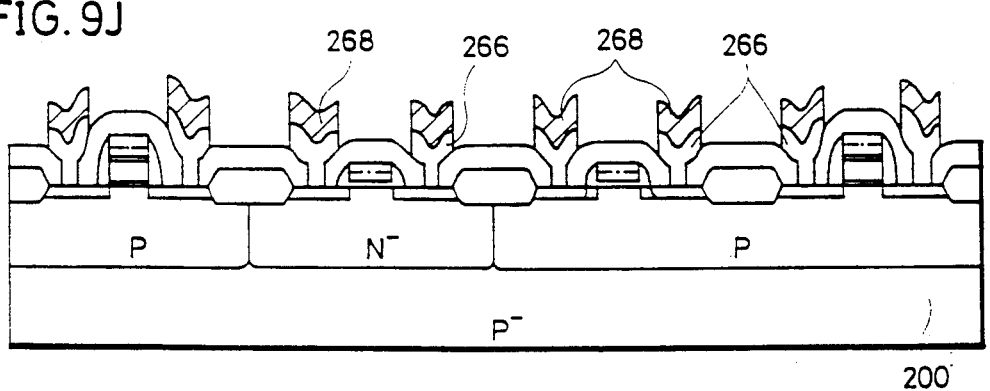

Referring to FIG. 9J, an Al—Si film 266 is formed by sputtering on the BPSG film 260 so as to fill the contact holes 264. A resist film 268 is then formed on a predetermined region on the Al—Si film 266, and thereafter etching is carried out with the resist film 268 used as a mask. Accordingly, an Al—Si interconnection layer is formed. The resist film 268 is then removed.

Figure 9K:
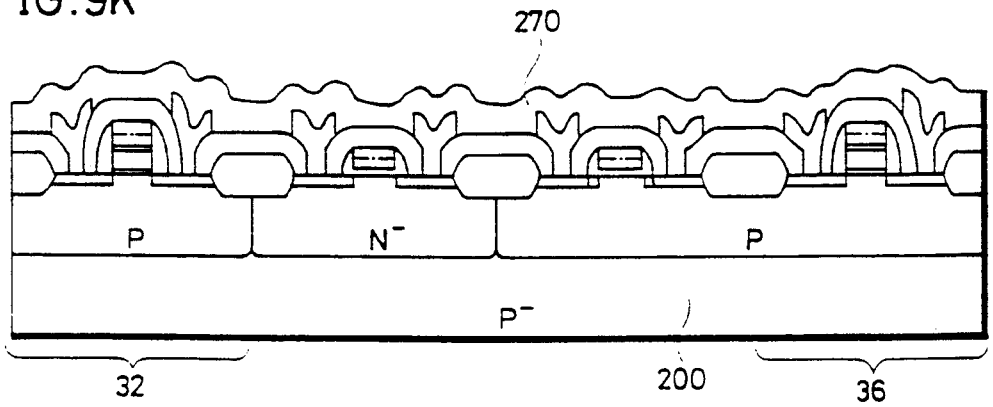

With reference to FIG. 9K, a protection film 270 made of a silicon nitride or a silicon oxide is formed on the whole surface of the silicon substrate 200. Through the foregoing steps, such a semiconductor device is manufactured as to have a double-gate structure in the EPROM region 32 and in the input protection transistor region 36 and have an LDD structure in the N-channel transistor region other than the EPROM region 32 and input protection transistor region 36. This manufacturing method makes it possible to simultaneously form the input protection transistor and the memory transistor, through a smaller number of the processing steps than those required for forming the input protection transistor as a single-layered gate separately from the memory transistor, thereby facilitating the manufacture.

When source/drain regions are formed in the EPROM region 32 and input protection transistor region 36 in the process shown in FIG. 9G described above, arsenic is also ion-implanted into a molybdenum silicide film 216b of the gate 216. Accordingly, there is an advantage that a flat film can be formed on the molybdenum silicide film 216b as will be describe later.

FIGS. 10A–10E show the changing process, according to the process after FIG. 9D, of the gate electrode and its peripheries in cross section in case where arsenic is not ion-implanted into the molybdenum silicide film. FIGS. 11A–11C show the process in cross-section in case where arsenic is ion-implanted into the molybdenum silicide film. The above described advantage will now be described with reference to FIGS. 10A–10E and 11A–11C.

Figure 10A:
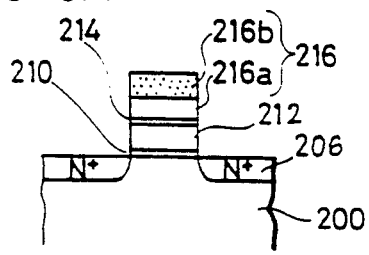
FIGS. 10A-10E are cross sectional views showing a changing process, according to the process after FIG. 9D, of a gate electrode and its peripheries in case where a molybdenum silicide film is not ion-implanted with arsenic.
Figure 11A:
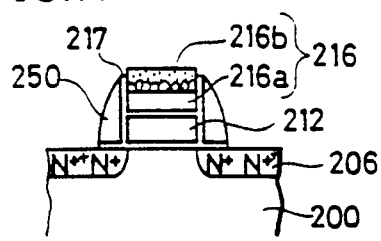
FIGS. 11A-11C are cross sectional views showing a changing process, according to the process after FIG. 9D, of the gate electrode and its peripheries in case where the molybdenum silicide film is ion-implanted with arsenic.
Figure 10B:
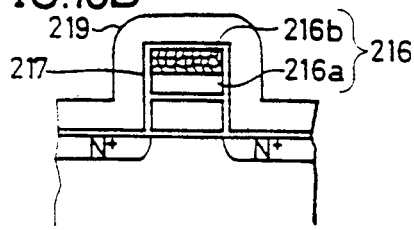
Figure 11B:
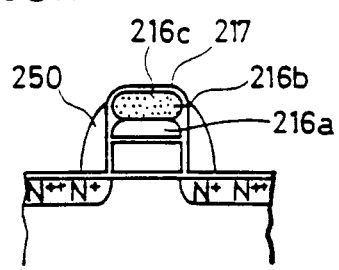
Figure 11C:
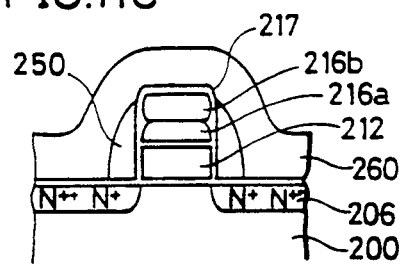

Referring to FIG. 10A, the gate 216 is exposed. This state of the gate 216 exposed corresponds to the state shown in FIG. 9D. Arsenic is ion-implanted into regions to be source/drain so that ions are not implanted into the gate 216. Then, a heat treatment is carried out for oxidation and activation. Accordingly, a silicon oxide film 217 is formed on the surface of the gate 216, and thus molybdenum silicide of the film 216b is polycrystallized, as shown in FIG. 10B.

Figure 10C:
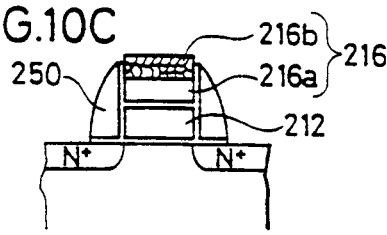
Figure 10D:
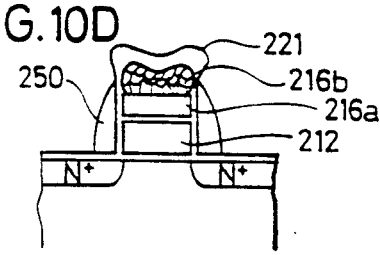
Figure 10E:
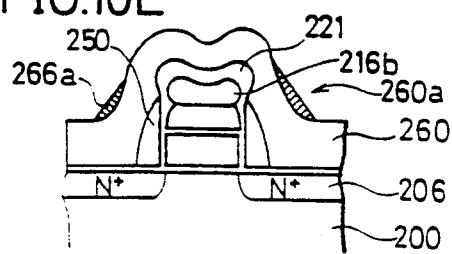

Next, in order to form sidewalls, a silicon oxide film 219 is formed on the overall surface of the substrate and is then etched by the RIE method. This causes sidewalls 250 to be formed at peripheries of the gates 216 and 212, with the surface of the molybdenum silicide film 216b being exposed, as shown in FIG. 10C. This state corresponds to the state shown in FIG. 9G. Next, in the step of forming P⁻ source/drain in the P-channel transistor region 33, when a heat treatment is carried out for oxidation and activation after ion implantation, molybdenum silicide is sublimated as $MoO_2$, $MoO_3$, as shown in FIG. 10D, so that the film 216b becomes thinner, whereby a porous thick silicon oxide film 21 is formed on the molybdenum silicide film 216b with its peripheries built up higher than its central portion. This produces a steep step or a steep configuration at gate portion. When the BPSG film 260 is formed covering the gate portion, as shown in FIG. 10E, the BPSG film 260 has a steep step portion 260a. Therefore, if an Al interconnection layer is formed after the formation of BPSG film 260, an undesired residue Al remains at the step portion 260a.

Referring to FIG. 11A, as shown in the embodiment of the present invention, if arsenic is ion-implanted into the molybdenum silicide film 216b upon the formation of source/drain regions, molybdenum silicide of a portion 216c of the film 216b is made amorphous. Thus, a silicon oxide film 217 is formed uniformly on the molybdenum silicide film 216b as shown in FIG. 11B. Accordingly, as shown in FIG. 11C, the BPSG film 260 no longer has such a steep step portion as shown in FIG. 10E, but is well planarized, which thus becomes advantageous for forming a multilayer interconnection.

While the semiconductor device having the EPROM has been described in the above embodiment, the present invention is not limitative to the EPROM but also applicable to any semiconductor devices having the double-layered gate structure. For example, the invention is applicable to an EEPROM (Electrically Erasable Programmable Read Only Memory). While the P type substrate is employed as the substrate in the above embodiment, an N type substrate may be employed, offering the same effect.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having an internal circuit including a memory device, and an input protection device for protecting said internal circuit, both said internal circuit and said input protection device being formed on one semiconductor substrate; wherein
   said input protection device comprises:
   source and drain impurity regions formed only of high concentration impurity regions, spaced apart from each other in a surface of said semiconductor substrate;
   a first insulator film formed on the surface of said semiconductor substrate between said source and drain impurity regions;
   a first electrode formed on said first insulator film;
   a second insulator film formed on said first electrode;
   a second electrode formed on said second insulator film;
   one region of said source and drain impurity regions of said input protection device being electrically connected to an interconnection for supplying an electrical signal to said internal circuit;
   the other region of said source and drain impurity regions of said input protection device and said semiconductor substrate being connected to a ground terminal;
   one of said first and second electrodes of said input protection device being connected by a conducting material to the ground terminal; and
   the other of said first and second electrodes being connected by a conducting material to said interconnection for supplying an electrical signal.

2. The semiconductor device of claim 1, wherein said internal circuit further comprises a transistor.

3. The semiconductor device of claim 2, wherein said transistor has an LDD structure.

4. The semiconductor device of claim 1, wherein said memory device comprises:
   source and drain impurity regions formed only of high concentration impurity regions, spaced apart from each other in a surface of said semiconductor substrate;
   a first insulator film formed on the surface of said semiconductor substrate between said source and drain impurity regions;
   a first electrode formed on said first insulator film;
   a second insulator film formed on said first electrode; and
   a second electrode formed on said second insulator film.

5. The semiconductor device of claim 1, wherein said first electrode is connected to the ground terminal and said second electrode is connected to said interconnection for supplying an electrical signal.

6. A semiconductor device having an internal circuit including a memory device, and an input protection device for protecting said internal circuit, both said internal circuit and said input protection device being formed on one semiconductor substrate; wherein
   said input protection device comprises:
   source and drain impurity regions formed only of high concentration impurity regions, spaced apart from each other in a surface of said semiconductor substrate;
   a first insulator film formed on the surface of said semiconductor substrate between said source and drain impurity regions;
   a first electrode formed on said first insulator film;
   a second insulator film formed on said first electrode;
   a second electrode formed on said second insulator film;
   one region of said source and drain impurity regions of said input protection device being electrically connected to an interconnection for supplying an electrical signal to said internal circuit;
   the other region of said source and drain impurity regions of said input protection device and said semiconductor substrate being connected to a ground terminal; and
   said first and second electrodes of said input protection device being connected to the ground terminal.

* * * * *